(12) United States Patent
Terasaki et al.

(10) Patent No.: US 8,568,639 B2
(45) Date of Patent: Oct. 29, 2013

(54) PROCESS FOR PRODUCING A DEVICE USING A MOLD

(75) Inventors: Atsunori Terasaki, Kawasaki (JP); Junichi Seki, Yokohama (JP); Nobuhito Suehira, Kawasaki (JP); Hideki Ina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/094,354

(22) Filed: Apr. 26, 2011

(65) Prior Publication Data

US 2011/0198783 A1    Aug. 18, 2011

Related U.S. Application Data

(62) Division of application No. 11/468,862, filed on Aug. 31, 2006, now abandoned.

(30) Foreign Application Priority Data

Sep. 6, 2005 (JP) ................... 2005-257394
Jul. 14, 2006 (JP) ................... 2006-194266

(51) Int. Cl.
*B29C 59/02* (2006.01)

(52) U.S. Cl.
USPC ............ 264/219; 264/319; 264/494; 264/496

(58) Field of Classification Search
USPC ........... 425/385; 428/446, 448, 450; 264/219, 264/319, 494, 496
See application file for complete search history.

(56) References Cited

U.S. PATENT DOCUMENTS

| | | | |
|---|---|---|---|
| 5,662,999 A * | 9/1997 | Taniguchi et al. | 428/408 |
| 6,309,580 B1 * | 10/2001 | Chou | 264/338 |
| 6,376,386 B1 | 4/2002 | Oshima | |
| 6,671,034 B1 | 12/2003 | Hatakeyama et al. | |
| 6,916,511 B2 | 7/2005 | Lee et al. | |
| 7,510,388 B2 | 3/2009 | Terasaki et al. | |
| 7,690,910 B2 | 4/2010 | Nakamura et al. | |
| 2003/0205658 A1 | 11/2003 | Voisin | |
| 2004/0022888 A1 | 2/2004 | Sreenivasan et al. | |
| 2004/0033424 A1 | 2/2004 | Talin et al. | |

(Continued)

FOREIGN PATENT DOCUMENTS

| | | |
|---|---|---|
| JP | 2003-272998 A | 9/2003 |
| JP | 2004-148494 A | 5/2004 |
| JP | 2004-200664 A | 7/2004 |

OTHER PUBLICATIONS

Stephen Y. Chou et. al., "Imprint of Sub-25 nm Vias and Trenches in Polymers," 67(21) Appl. Phys. Lett. 3114-16 (1995).

*Primary Examiner* — Joseph Del Sole
*Assistant Examiner* — Ryan Ochylski
(74) *Attorney, Agent, or Firm* — Fitzpatrick, Cella, Harper & Scinto (57) ABSTRACT

In order to provide a mold and an imprint apparatus which permit adjustment of a depth of an imprint pattern after the imprint pattern is formed, the mold is constituted by a mold substrate including a first material and a surface layer, constituting a projection of the mold and including a second material, for forming a pattern on the photocurable resin material. The first material is more etchable than the second material. The first material and the second material have optical transmittances capable of curing the photocurable resin material with respect to at least a part of wavelength range of ultraviolet light.

7 Claims, 6 Drawing Sheets

(56) References Cited

U.S. PATENT DOCUMENTS

| | | |
|---|---|---|
| 2004/0115568 A1 | 6/2004 | Schmidt |
| 2004/0141168 A1 | 7/2004 | Sreenivasan et al. |
| 2006/0255505 A1* | 11/2006 | Sandhu et al. ................ 264/293 |
| 2007/0054097 A1 | 3/2007 | Suehira et al. |
| 2010/0294146 A1* | 11/2010 | Fragala et al. .................. 101/28 |

* cited by examiner

PROCESS FOR PRODUCING A DEVICE USING A MOLD

CROSS-REFERENCE TO RELATED APPLICATIONS

This application is a division of application Ser. No. 11/468,862, filed Aug. 31, 2006, which claims priority from Japanese Patent Applications Nos. 257394/2005, filed Sep. 6, 2005, and 194266/2006 filed, Jul. 14, 2006. All prior applications are incorporated herein by reference in their entireties.

FIELD OF THE INVENTION AND RELATED ART

The present invention relates to a mold and an imprint apparatus.

In recent years, a fine processing technology for transferring a fine structure on a mold onto a member to be processed, such as a resin material or a metal material, has been developed and has received attention. This technology is called nanoimprint or nanoembossing and has a dissolution on the order of several nanometers, so that expectations are growing that the technology is used as a next-generation semiconductor fabrication technology in place of a light exposure apparatus such as a stepper or a scanner.

The technology can permit simultaneous processing of three-dimensional structure, so that it is expected to be applied to the following production technologies other than the semiconductor fabrication technology. For example, the technology is expected to be applied to various fields of production technologies including those of optical devices such as photonic crystal and those of a biochip such as micro total analysis system (μ-TAS).

Application of imprint processing to the semiconductor fabrication technology is described in, e.g., Stephan Y. Chou et al., Appl. Phys. Lett., Vol. 67, Issue 21, pp. 3114-3116 (1995). More specifically, a work or workpiece constituted by disposing a layer of a photocurable resin material on a substrate such as a semiconductor wafer is prepared. A mold having a processing surface (surface to be processed) on which a desired imprint pattern is formed is pressed against the work, followed by further pressure application and irradiation with ultraviolet light (ultraviolet rays) to cure the photocurable resin material. In this manner, the pattern is imprinted onto the resin layer, so that the resin layer is used as a mask to effect etching, thus performing pattern formation on the substrate.

The processing by imprint is performed by transferring a shape of imprint pattern including a recess and a projection formed on a processing surface of a mold onto a member to be processed. As a substrate for the mold on which the imprint pattern is formed, quartz (silica or fused silica) is generally used. During etching of the imprint pattern at the processing surface of the mask including the quartz substrate, a layer (film) of Cr is generally used as a hard mask. As the material for the hard mask other than Cr, U.S. Patent Application Publication No. US2003/0205658 has disclosed polysilicon and silicide.

SUMMARY OF THE INVENTION

An object of the present invention is to provide a mold capable of adjusting a depth of an imprint pattern of the mold after the mold is prepared.

Another object of the present invention is to provide an imprint apparatus including the mold.

According to an aspect of the present invention, there is provided a mold for imprinting a pattern on a photocurable resin material, comprising:

a mold substrate comprising a first material; and a surface layer, constituting a projection of the mold and comprising a second material, for forming a pattern on the photocurable resin material;

wherein the first material is more etchable than the second material, and wherein the first material and the second material have optical transmittances capable of curing the photocurable resin material with respect to at least a part of wavelength range of ultraviolet light.

The mold according to the present invention is constituted so that it is possible to effect imprint while leaving a hard mask, used for etching, as a surface layer without removing the hard mask during formation of an imprint pattern onto a mold processing surface. Further, during adjustment of a depth of the imprint pattern, the mold is constituted so that the remaining surface layer can be used again as a mask for etching. Based on such a constitution, it is possible to adjust the depth of the pattern of the mold after the mold is prepared.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2(a) to 2(e) are schematic sectional views for illustrating an embodiment of preparation steps of the mold of the present invention.

FIGS. 4(a) to 4(c) are schematic sectional views for illustrating the case where a depth of a recess of a mold is decreased after the mold is prepared.

FIGS. 6(a) to 6(f) are schematic sectional views for illustrating a preparation process of a device using the mold of the present invention.

DETAILED DESCRIPTION OF THE PREFERRED EMBODIMENTS

A deep depth of a recess of a mold used in imprint processing is not always better. For example, when a mold is pressed against a resin layer as a mask layer and then is removed from the resin layer, a shallow depth of a recess of the mold permits easier removal of the mold. On the other hand, with respect to a performance of the resin layer, on which a pattern is to be formed, as a mask layer, it is desirable that the mold recess has a deeper depth since a thicker resin layer is usable. In these circumstances, in the case of effecting optimum imprint, it is necessary to optimize a depth of an imprint pattern.

However, in order to change the depth of the imprint pattern of the mold after the mold is prepared, there is no other way but to prepare a mold once again. For this reason, further cost and time are required, thus being inefficient. This is because formation of the mold pattern with high definition by using an EB exposure apparatus which has been generally used requires much cost and time. Further, the cost and time required for the formation of the mold pattern are cumulatively increased for each additional preparation of mold.

In view of this problem, the inventors have come to recognition that it is possible to effect efficient imprint when the depth of the imprint pattern is adjustable after the mold is prepared.

In this regard, however, it is also possible to consider that a hard mask of Cr used during processing of mold is left without being removed and is used as a mold for adjusting a depth of the imprint pattern. However, the hard mask of Cr has a very low transmittance to ultraviolet light, so that it is difficult to cure a photocurable resin material formed on a substrate by passing ultraviolet light through the hard mask of Cr.

Further, a hard mask of polysilicon or silicide used as the hard mask as described in U.S. Patent Application Publication No. US2003/0205658 also has a very low transmittance to ultraviolet light. For this reason, it is similarly difficult to cure a photocurable resin material formed on a substrate.

All the above described materials have very low transmittances to ultraviolet light, so that the photocurable resin material is not readily cured by irradiation of ultraviolet light through these materials. As a result, there arises such a problem that the uncured resin material is adhered to the mold to result in contamination which impedes subsequent processing.

As described above, the conventionally used hard mask materials such as Cr, polysilicon, and silicide are required to be removed before the imprint is effected. For this reason, they are not suitable for a mask for additional etching which is performed after the mold is once processed.

The mold according to the present invention includes a mold substrate formed of a first material and a surface layer constituting a projection of the mold. The surface layer is formed of a second material and is a layer for forming a pattern on a photocurable resin material. The first material is more etchable than the second material. Further, the first material and the second material have optical transmittances capable of curing the photocurable resin material with respect to at least a part of wavelength range of ultraviolet light.

Hereinbelow, an embodiment of the present invention will be described.

Figure 1:
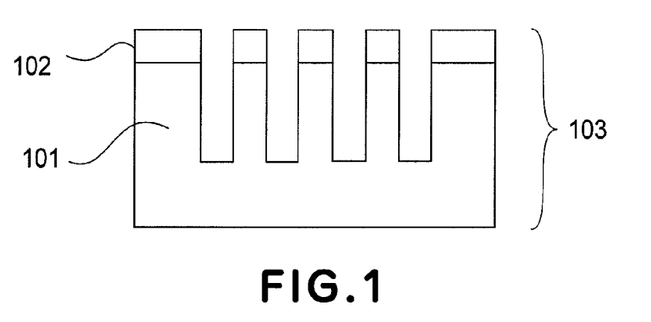
FIG. 1 is a schematic sectional view showing an embodiment of the mold according to the present invention.

As shown in FIG. 1, a mold 103 is constituted by a mold substrate 101 formed of a first material and a surface layer 102 formed of a second material different from the first material.

The mold 103 has an imprint pattern formed at the surface of the mold substrate 101 and has a projection at which the surface layer 102 is provided. The surface layer 102 is formed by leaving a hard mask, used when the imprint pattern is formed at a processing surface of the mold 103, as it is without removing the hard mask.

In other words, the surface layer 102 is a layer which remains on the mold substrate 101 without being removed when the imprint is performed and which is used for pattern formation of a photocurable resin material. Further, the surface layer 102 is also a layer functioning as a mask during adjustment of a depth of the pattern of the mold after the imprint is effected.

When the surface layer 102 is used for the pattern formation of the photocurable resin material, it may directly contact the photocurable resin material. Further, the surface layer 102 may also indirectly contact the photocurable resin material through a release agent applied onto the surface layer 102. The surface layer 102 may be constituted in a single layer form or a multilayer form.

The first material for the mold substrate 101 and the second material for the surface layer 102 have optical transmittances capable of curing the photocurable resin material with respect to light in at least a part of wavelength range of ultraviolet light. As a result, the photocurable resin material can be cured, so that it is possible to effect imprint of the pattern formed on the mold surface. As the first material for the mold substrate 101, it is possible to use silicon oxide etc. As the second material for the surface layer 102, it is possible to use silicon nitride, titanium oxide, aluminum oxide, calcium fluoride, indium tin oxide (ITO), zinc oxide, etc.

Incidentally, the photocurable resin material is basically cured by increasing an amount of light exposure unless an optical transmittance to ultraviolet light is zero. However, in view of an actual throughput, a somewhat high transmittance is required. For example, in the case where a light source emitting light at a wavelength of 365 nm is used as a light source used for a photocuring process, a film of silicon oxide used as the first material for the mold substrate 101 described above has an optical transmittance of approximately 90% with respect to the 365 nm wavelength light. Accordingly, in order not to considerably lower a throughput compared with the case of silicon oxide as the first material for the mold substrate 101, it is desirable that the surface layer 102 at least has an optical transmittance of not less than 30%.

Further, when the mold substrate 101 and the surface layer 102 provide a large difference in optical transmittance, there is a possibility that an irregularity in degree of curing of the photocurable resin material is caused to occur. For this reason, the transmittances of both materials may preferably be as close as possible. In a more preferred embodiment, the second material for the surface layer 102 has an optical transmittance of not less than 80%.

Further, in order to effect the adjustment of depth of the imprint pattern of the mold after the mold is prepared, it is necessary for the first material and the second material to be a combination such that the first material is more etchable than the second material.

In order to selectively remove the first material, it is necessary to increase an etching rate of the first material for the mold substrate 101 compared with an etching rate of the second material for the surface layer 102. In the present invention, the first material may be substantially removed selectively, so that some degree of the second material may also be removed. The etching rate can be represented by a ratio of etched layer thickness to etching time (e.g., nm/min).

In this embodiment, in order to selectively remove the first material, by etching, compared with the second material, it is possible to employ reactive ion etching using gas having a high C/F ratio, such as those of $C_3F_8$, $C_4F_8$, $C_5F_8$, and $C_4F_6$, as source gas. In the case there the first material for the mold substrate 101 is silicon oxide and the second material for the surface layer 102 is silicon nitride in the above described treatment condition, a ratio of etching rate of first material to etching rate of second material is approximately 10-30. Further, in the same treatment condition, the etching rate ratio of silicon oxide to a resist is approximately 3-8. Incidentally, in the case where the surface layer 102 is thinner than the resist mask layer, the etching rate ratio may desirably be not less than 20.

Further, in the case of employing wet etching, it is possible to use, e.g., hydrofluoric acid. The wet etching is effective in formation of a pattern having a width exceeding several ten micrometers.

The depth of the mold varies depending on a width of a pattern to be formed but may preferably provide an aspect ratio, defined as (depth of mold)/(minimum width of pattern to be formed), of 0.5-10. Further, a ratio of the thickness of surface layer 102 to the depth of mold 103 may preferably be not less than 20%, e.g., in the case where the etching rate ratio is not less than 10 and the number of depth adjustment is not less than 3. The thickness of the mold substrate 101 may desirably be not less than several micrometers in consideration of mechanical strength.

As described above, the present invention is characterized in that the surface layer is not removed when the mold is completed, so that it is possible to adjust a depth of a recess of the mold even after the imprint is effected. In the mold preparation process, a step requiring much cost and time is a step of forming the imprint pattern. According to the present invention, it is possible to variably change the depth of the recess of the mold after the imprint is effected, so that it is not necessary for the mold to be prepared again from scratch. Accordingly, it is possible to reduce cost and time required for the pattern formation step.

Hereinafter, the present invention will be described based on embodiments.

Embodiment 1

A production process of a mold according to the present invention will be described in Embodiment 1. FIGS. 2(a) to 2(e) are sectional views for illustrating preparation steps of a mold 103 in this embodiment.

Figure 2:
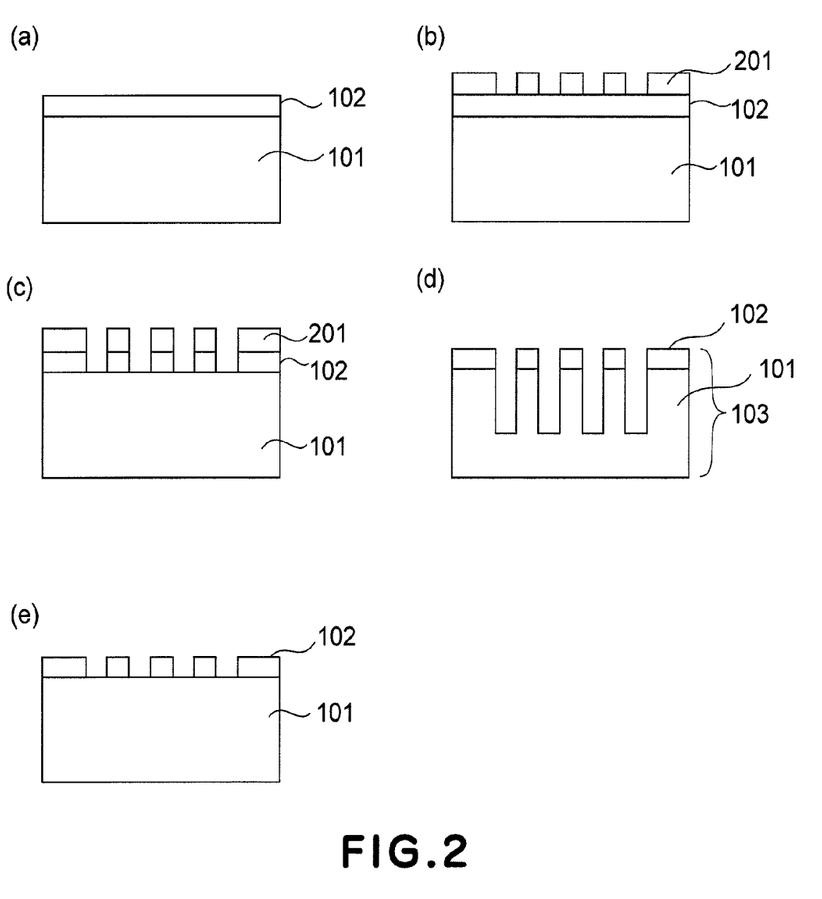

(1) A surface layer 102 is formed in a film on a mold substrate 101 (FIG. 2(a)). As a first material for the mold substrate 101, silicon oxide or the like is used. As a second material for the surface layer 102, it is possible to use silicon nitride, titanium oxide, aluminum oxide, calcium fluoride, indium tin oxide (ITO), zinc oxide, etc. The surface layer 102 may also be formed in a multilayer form in addition to the single layer form.

(2) On the surface layer 102, a resist 201 is disposed and patterned (FIG. 2(b)). The patterning may be effected by utilizing light exposure with a stepper or a scanner or electron beam drawing.

(3) The surface layer 102 is etched (FIG. 2(c)).

(4) After the resist 201 is stripped, the mold substrate 101 is etched with the surface layer 102 as a mask layer (FIG. 2(d)). The etching is performed by reactive ion etching using gas having a high C/F ratio such as $C_3F_8$, $C_4F_8$, $C_5F_8$ or $C_4F_6$, as source gas as described above. Incidentally, the mold substrate 101 may also be etched by leaving the resist 201 and using the surface layer 102 and the resist 201 as the mask layer.

In another embodiment, it is also possible to prepare a mold of the present invention by stripping the resist 201 and then not subjecting the mold substrate 101 to etching (FIG. 2(e)). In this case, the surface layer 102 constitutes the entire projection of the mold 103.

In the above embodiment, the surface layer 102 is formed on the mold substrate 101 and thereon the resist 201 is formed. The surface layer 102 may also be provided by using a so-called lift-off method. More specifically, the resist 201 is formed on the mold substrate 101 and is partially removed by etching. Then, after the surface layer 102 is formed, the resist is stripped and then the mold substrate 101 is etched. In this manner, it is also possible to prepare the mold according to the present invention.

As described above, the mold 103 having the surface layer 102, which has been used as the hard mask during formation of an imprint pattern on a processing surface, left on the mold substrate 101 as shown in FIG. 1 is prepared.

The first material of the mold substrate 101 and the second material for the surface layer 102 which constitute the mold 103 have optical transmittances capable of curing a photocurable resin material with respect to light in at least a part of wavelength range of ultraviolet light.

Accordingly, even when the surface layer 102 is not removed but left on the mold substrate 101, it is possible to transfer the imprint pattern of the mold 103 onto the photocurable resin material.

Incidentally, in the conventional case where the Cr layer is used as the hard mask for forming the imprint pattern on the mold processing surface through etching and is subjected to etching for re-processing while being left on the mold substrate without being removed, there is concern about an occurrence of metal contamination. However, in this embodiment, there is no such concern.

Embodiment 2

A method of adjusting a depth of an imprint pattern of the mold according to the present invention after the mold is prepared will be described in Embodiment 2.

Figure 3:
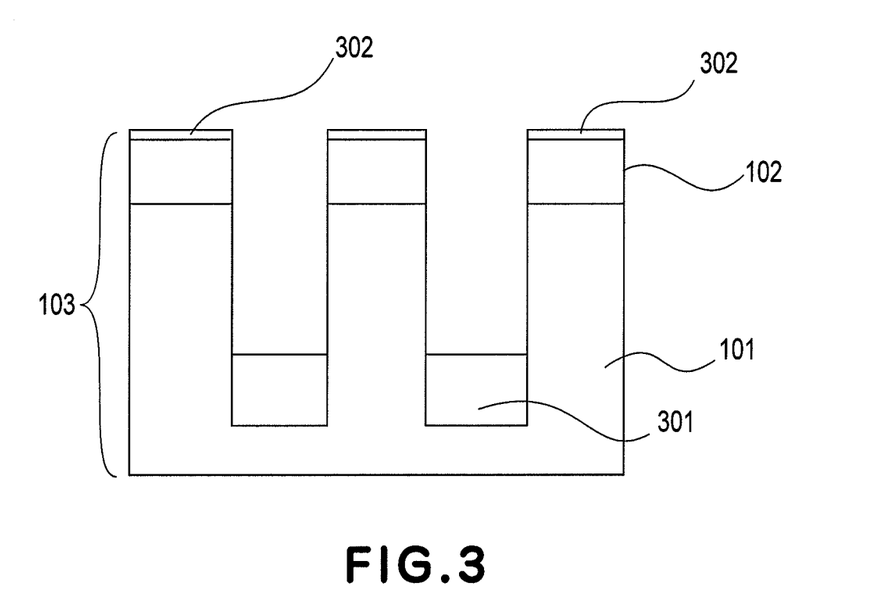
FIG. 3 is a schematic sectional view for illustrating the case where a depth of a recess of a mold is increased after the mold is prepared.

FIG. 3 is a sectional view for illustrating an embodiment in the case of increasing a depth of a recess of the mold after the mold is prepared.

In this case, additional etching of the mold substrate 101 is only effected by using the etching method described in Embodiment 1 while using the surface layer 102 as a mask layer. More specifically, a portion 301 at the recess of the mold substrate 101 is etched together with a portion 302 of the surface layer 102.

Figure 4:
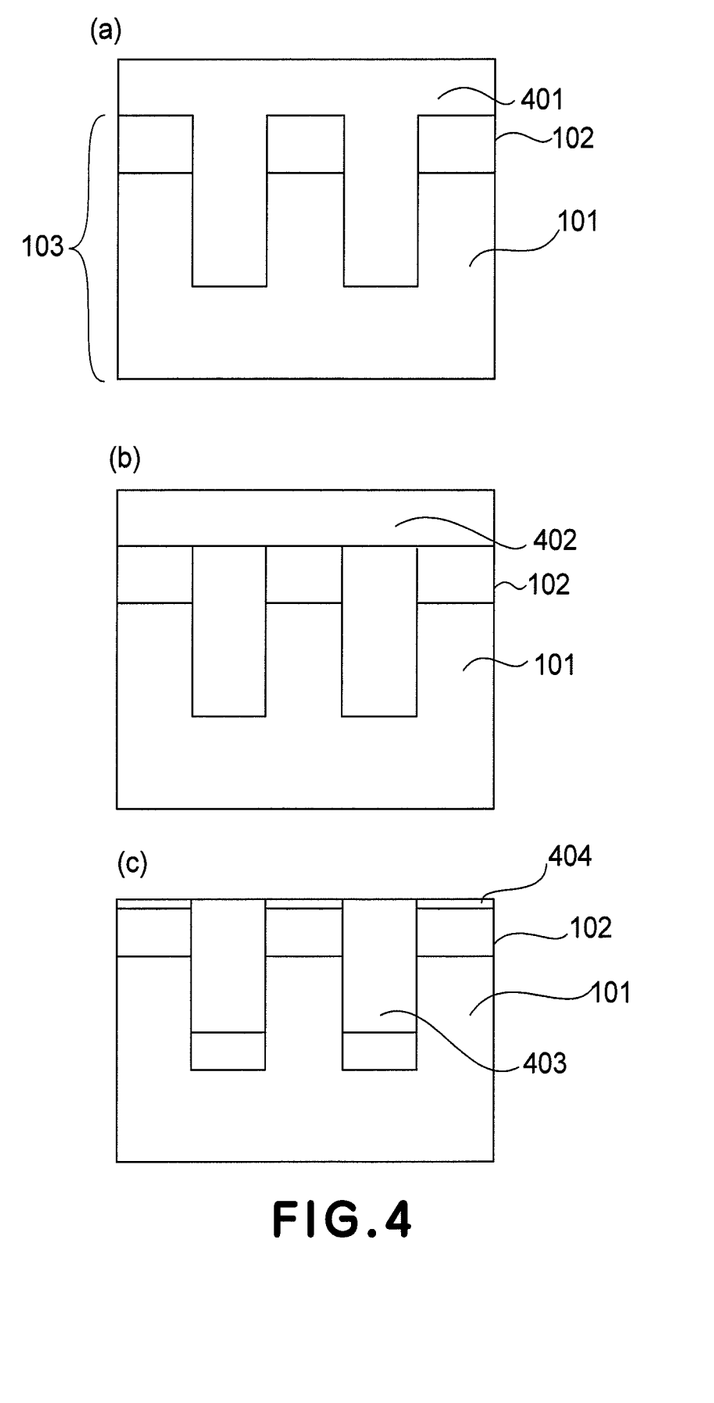

FIGS. 4(a) to 4(c) are sectional views for illustrating an embodiment in the case of decreasing the depth of the recess of the mold after the mold is prepared.

(1) On the entire surface of the mold 103, a material 401 identical to that of the mold substrate 101 is formed in a layer so as to fully fill the recess of the mold 103 (FIG. 4(a)).

(2) The resultant structure is etched and flattened by etching a portion 402 of the layer 401 (FIG. 4(b)), thus exposing the surface of the mold 103 (FIG. 4(c)).

(3) By employing the etching method described in Embodiment 1, the remaining portion of the layer 401 is etched. More specifically, a portion 403 of the layer 401 is etched together with a portion 404 of the surface layer 102 (FIG. 4(c)).

As described above, it is possible to appropriately adjust the depth of the recess of the mold 103 after the mold 103 is prepared.

Embodiment 3

A modified embodiment of a production process of the mold according to the present invention will be described in Embodiment 3.

Figure 5:
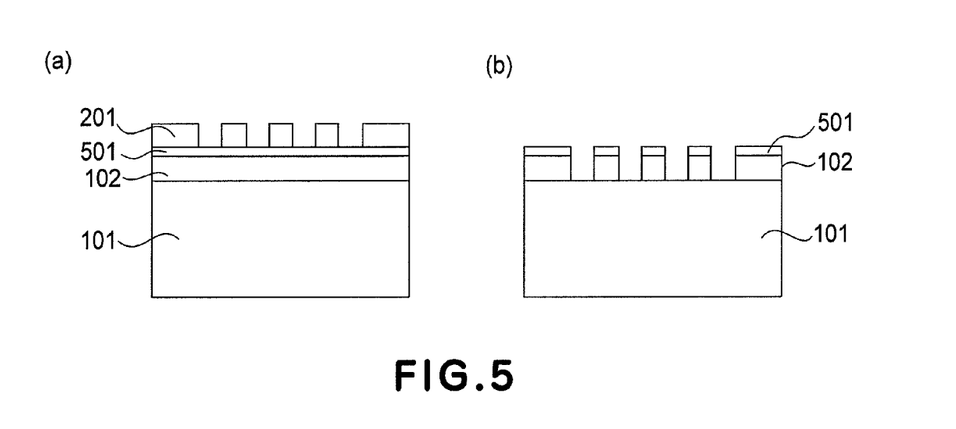
FIGS. 5(a) and 5(b) are schematic sectional views for illustrating another embodiment of preparation steps of the mold of the present invention.

FIGS. 5(a) and 5(b) are sectional views for illustrating the modified embodiment of the mold production process.

In the case of effecting re-processing of the mold as in the case described with reference to FIGS. 3 and 4(a) to 4(c), the portions 302 and 404 of the surface layer 102 can also be somewhat etched. For this reason, the thickness of the surface layer 102 may desirably be increased. However, when a thick surface layer 102 is etched with the resist 201 as the mask layer, a shape of a side wall portion is deformed to lower an accuracy of pattern to be transferred onto the mold substrate 101 is some cases. For this reason, as shown in FIG. 5(a), an additional hard mask layer 501 is provided between the resist 201 and the surface layer 102.

Next, by using the resist 201, the hard mask layer 501 is etched and then the surface layer 102 is etched using the hard mask layer 501 as a mask layer (FIG. 5(b)).

As a material for the hard mask layer 501, it is suitably possible to use a metal material such as Cr, WSi or Al. There is no problem even when the hard mask layer 501 is left on the surface layer 102 during etching of the mold substrate 101 in a subsequent step. However, the hard mask layer 501 is removed at least before imprint.

Embodiment 4

In Embodiment 4, a device production process using the mold of the present invention and an imprint apparatus including the mold of the present invention will be described.

FIGS. 6(a) to 6(f) are sectional views for illustrating production steps for effecting imprint of an imprint pattern.

Figure 6:
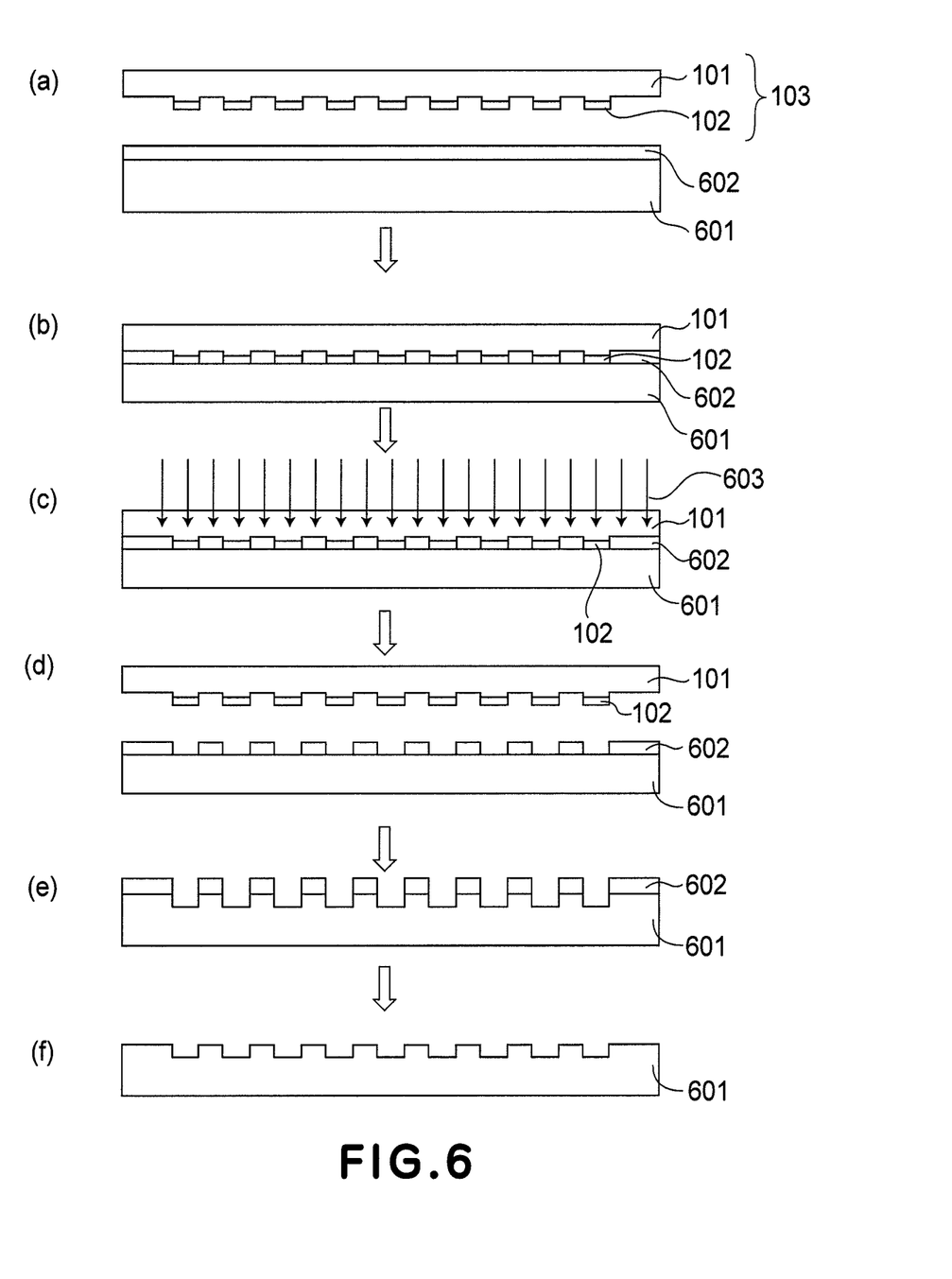

First, onto a substrate 601, a photocurable resin material 602 is applied (FIG. 6(a)). Next, the mold 103 and the substrate 601 are caused to come close to and contact each other (FIG. 6(b)). The resultant structure is irradiated with ultraviolet light 603 from a back side of the mold 103 to cure the photocurable resin material 602 (FIG. 6(c)). Thereafter, the mold 103 is moved away from the substrate 601 (FIG. 6(d)), and a pattern is transferred onto the substrate 601 by etching (FIG. 6(e)). Finally, when the photocurable resin material 602 is removed from the substrate 601, the pattern is formed on the substrate 601 (FIG. 6(f)).

In the case of preparing a semiconductor device, examples of the material for the substrate 601 or its surface layer may include silicon, silicon oxide, silicon nitride, silicon carbide, an insulating film of low dielectric constant (low-k) material, aluminum, copper, gallium arsenide, gallium nitride, etc. Further, in the case of preparing photonic crystal, as the material for the substrate 601, it is possible to use silicon, titanium oxide, gallium nitride, etc. Further, in the case of preparing a biochip, as the material for the substrate 601, it is possible to use silicon, silicon oxide, etc.

Figure 7:
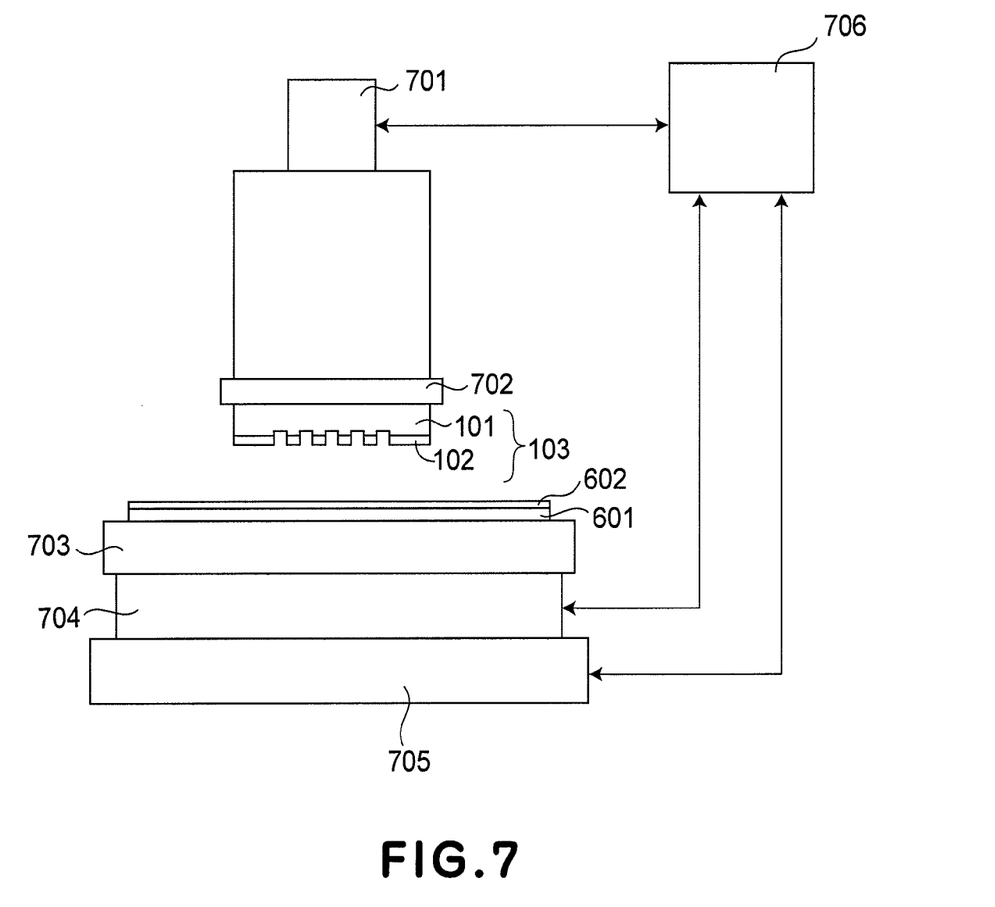
FIG. 7 is a schematic view for illustrating a constitution of an imprint apparatus including the mold of the present invention.

FIG. 7 shows a constitution of the imprint apparatus including the mold of the present invention.

Referring to FIG. 7, the imprint apparatus includes an exposure light source 701, a mold holding portion 702, a work holding portion 703, a work pressing mechanism 704, an in-plane moving mechanism 705, and an imprint control mechanism 706.

By the work pressing mechanism 704, the mold 103 and the substrate 601 are caused to contact each other through the photocurable resin material 602.

Ultraviolet light emitted from the exposure light source 701 passes through the mold holding portion 702 and the mold 103 in this order and cures the photocurable resin material 602. Then, the mold 103 and the substrate 601 are moved away from each other by the work pressing mechanism 704. As desired, after the substrate 601 is moved by the in-plane moving mechanism 705, a so-called step-and-repeat method in which transfer of the pattern in an area adjacent to the pattern-transferred area is performed again is effected.

Incidentally, the work pressing mechanism 704 and the in-plane moving mechanism 705 may also be provided on the mold holding portion 702 side.

Embodiment 5

In Embodiment 5, a mold in which the first material and the second material described above have optical transmittances capable of being optically measured will be described.

As described above, efficient imprint can be effected when the depth of the imprint pattern is adjustable after the mold is prepared. In this regard, in the conventional embodiment, as the mold for the hard mask used during the processing of mold, it was possible to use Cr, polysilicon, silicide, etc. It is also possible to consider that the hard mask is used as a mask for adjusting the depth of the imprint pattern without being removed.

However, these materials (Cr, polysilicon, and silicide) have very low transmittances to visible light. For this reason, e.g., in the case where a visible light source is used as a light source for observing an alignment mark, such a problem that alignment using the mold is not readily effected arises.

In this embodiment, the mold is a mold for imprinting a pattern on a resin material such that it includes a mold substrate formed of a first material; and a surface layer, constituting a projection of the mold and formed of a second material, for forming a pattern on the photocurable resin material. The mold is characterized in that the first material is more etchable than the second material, and wherein the first material and the second material have optical transmittances capable of being optically measured.

As the material for the mold substrate, similarly as in Embodiment 1, silicon oxide or the like can be used. Further, as the material for the surface layer, similarly as in Embodiment 1, it is possible to use silicon nitride, titanium oxide, aluminum oxide, calcium fluoride, ITO, zinc oxide, etc.

The mold in this embodiment is also applicable to other optical measurements, such as those for a reflectance at the substrate surface, an interference of distance between the mold and the substrate, and absorptivity of resin material.

While the invention has been described with reference to the structures disclosed herein, it is not confined to the details set forth and this application is intended to cover such modifications or changes as may come within the purpose of the improvements or the scope of the following claims.

What is claimed is:

1. A process for producing a device, comprising:
  preparing a mold comprising:
    a mold substrate comprising a recess and a projection, which are formed of a first material, constituting a recess of the mold; and
    a surface layer, which is formed of a second material on the projection of the mold substrate formed of the first material and which constitutes a projection of the mold, for forming a pattern on a curable photocurable resin material,
    wherein the first material is more etchable than the second material, and
    wherein the first material and the second material are capable of allowing the curable resin material to be cured with respect to at least a part of a wavelength range of ultraviolet light;
  causing the surface layer of the mold to contact the curable resin material on a first substrate without removing the second material;
  irradiating the curable resin material on the first substrate with ultraviolet light through the mold;
  preparing an adjusted mold comprising increasing a depth of the pattern of the mold by etching the mold substrate while using the surface layer as a mask;
  causing the surface layer of the adjusted mold to contact the curable resin material on a second substrate different from the first substrate; and
  irradiating the curable resin material on the second substrate with ultraviolet light through the adjusted mold.

2. The process according to claim 1, wherein a ratio of an etching rate of the first material to an etching rate of the second material is not less than 10.

3. The process according to claim 1, wherein the second material has an optical transmittance, to light at a wavelength of 365 nm, of not less than 30%.

4. The process according to claim 1, wherein the first material is silicon oxide and the second material is selected from the group consisting of silicon nitride, titanium oxide, aluminum oxide, calcium fluoride, and indium tin oxide.

5. The process according to claim 1, wherein the curable resin material is an ultraviolet curable resin material.

6. A process for producing a device, comprising:
   preparing a mold comprising:
      a mold substrate comprising a first material; and
      a surface layer, constituting a projection of the mold and comprising a second material, for forming a pattern on a curable resin material;
      wherein the first material is more etchable than the second material, and
      wherein the first material and the second material have optical transmittances capable of curing the curable resin material with respect to at least a part of a wavelength range of ultraviolet light;
   causing the surface layer of the mold to contact the curable resin material on a first substrate without removing the second material;
   irradiating the curable resin material on the first substrate with ultraviolet light through the mold;
   preparing an adjusted mold comprising increasing a depth of the pattern of the mold by etching the mold substrate while using the surface layer as a mask;
   causing the surface layer of the adjusted mold to contact the curable resin material on a second substrate different from the first substrate; and
   irradiating the curable resin material on the second substrate with ultraviolet light through the adjusted mold.

7. The process according to claim 6, wherein the curable resin material is an ultraviolet curable resin material.

* * * * *